(12) United States Patent
Lee

(10) Patent No.: US 7,189,118 B2
(45) Date of Patent: Mar. 13, 2007

(54) MINI SD CARD ADAPTER

(76) Inventor: Yun-Hsiu Lee, 15F, No. 88, Hsing-De Rd., San Chung, Taipei Hsien (TW)

( * ) Notice: Subject to any disclaimer, the term of this patent is extended or adjusted under 35 U.S.C. 154(b) by 0 days.

(21) Appl. No.: 11/360,623

(22) Filed: Feb. 24, 2006

(65) Prior Publication Data

US 2007/0004285 A1 Jan. 4, 2007

(30) Foreign Application Priority Data

Jul. 1, 2005 (TW) .............................. 94211133 U

(51) Int. Cl.
*H01R 24/00* (2006.01)
(52) U.S. Cl. ..................... 439/630; 439/945; 439/946
(58) Field of Classification Search ................ 439/630, 439/638, 945, 946
See application file for complete search history.

(56) References Cited

U.S. PATENT DOCUMENTS 7,033,223 B1 * 4/2006 Lin ............................. 439/630

2004/0229511 A1 * 11/2004 Chen ........................... 439/638

* cited by examiner

*Primary Examiner*—Javaid H. Nasri
(74) *Attorney, Agent, or Firm*—Troxell Law Office PLLC

(57) ABSTRACT

A Mini SD card adapter including an upper plastic shell, a lower plastic shell, a metallic shell, a terminal set and a write protect tab, whereby the Mini SD card adapter enables converting a relatively small sized Mini SD card into a larger sized SD card for use by a user, and is characterized in that the terminal set is fixed within corresponding terminal holes defined in the upper plastic shell using a direct insertion method. In addition, an appropriately positioned bend of a fourth terminal of the terminal set serves a grounded portion that provides for direct electrical grounding with the metallic shell. Accordingly, the upper plastic shell and lower plastic shell, the metallic shell and the write protect tab can be rapidly and conveniently assembled to form a finished product, thereby achieving objective of increasing yield of the finished product.

4 Claims, 4 Drawing Sheets

MINI SD CARD ADAPTER

BACKGROUND OF THE INVENTION (a) Field of the Invention

The present invention relates to an improved structure for a Mini SD card adapter, and more particularly to a converter structure that facilitates rapid assembly, and enables converting a relatively small sized Mini SD card into a larger sized SD card for use by a user.

(b) Description of the Prior Art

Constant improvements in technology have provided the expansion memory card with advantages including small size, fast reading speed and a continually increasing capacity, thus, many consumer electronic products that use expansion memory cards have appeared on the market in order to increase convenience of use and good expansion capability of the consumer electronic product (such as: notebook computers, digital cameras, cell phones, handheld computers, and so on). In general, the more familiar expansion memory cards presently available include the following types: CF (Compact Flash), MD (MicroDrive), SD (Secure Digital), MC (MultiMedia Card), MS (Memory Stick) and SM (Smart Media). The majority of present consumer electronic products demand a light and small structural design, hence, a great many of small sized expansion memory cards have appeared on the market, such as Mini SD (Mini Secure Digital), RS MMC (Reduced Size Multi Media Card), TF (Trans Flash), and so on. Moreover, card adapters have emerged to accommodate enabling compatible use of relatively small sized expansion memory cards with older models of electronic products, wherein a relatively small sized expansion memory card is able to be inserted into the card adapter, which is then directly inserted into the electron consumer product for use by a user. There are many types of card adapters on the market, and the present description is primarily directed towards a Mini SD card adapter, which enables switching a relatively small sized Mini SD card into a relatively larger SD card for use by a user. Referring to FIG. 1, which shows a prior art Mini SD card adapter structured to comprise an upper plastic shell a, a lower plastic shell b, a terminal set c and a write protect tab d. A press piece a1 and placement slots b1 are located in the upper and lower plastic shells a, b respectively corresponding to the terminal set c. When assembling the Mini SD card adapter, each terminal c1 in the terminal set c must be aligned within the corresponding placement slot b1. In addition, appropriately grounded metallic pieces must respectively extend outside of the upper and lower plastic shells a, b and make electrical contact with the fourth terminal in the terminal set c. Hence, assembling the aforementioned prior art structure is not only time consuming and senseless, moreover, the additional grounded metallic pieces easily come off, resulting in the inability to ensure stability of assembly quality. Hence, there is a need for improvement in prior art.

SUMMARY OF THE INVENTION

In light of the shortcomings of the aforementioned structure of prior art, the inventor of the present invention, having accumulated years of experience in related arts, attentively and circumspectly carried out extensive study and exploration to ultimately design a new improved structure for a Mini SD card adapter.

A primary objective of the present invention is to provide a Mini SD card adapter that is not only convenient to assemble, but is also able to increase yield of the finished product.

In order to achieve the aforementioned objectives, the improved structure of the Mini SD card adapter of the present invention is structured to comprise an upper plastic shell, a lower plastic shell, a metallic shell, a terminal set and a write protect tab. The terminal set is fixed within corresponding terminal holes defined in the upper plastic shell using a direct insertion method. A plurality of position fixing holes, clasps and clasp holes are respectively located on the upper plastic shell, which can be joined together with corresponding position fixing pieces, clasp hole pieces and hook pieces located on the metallic shell. Moreover, a plurality of fixing holes are defined at appropriate positions in a periphery of an undersurface of the upper plastic shell, and appropriately sized fixing pieces and a plurality of clasp pieces are respectively located on the lower plastic shell corresponding to the plurality of fixing holes. Furthermore, a slide groove, which is used for disposing the write protect tab therein, is defined in one side of the lower plastic shell, and a toggle device extends frontward from a front end of the write protect tab. In addition, an appropriately positioned bend of a fourth terminal of the terminal set serves as a grounded portion that provides for direct electrical grounding with the metallic shell.

According to the aforementioned structure, when assembling the Mini SD card adapter of the present invention, the terminal set is first fixed within the corresponding terminal holes of the upper plastic shell using a direct insertion method, thereby enabling the terminal set and the upper plastic shell to form an integrated device member, which will not easily come loose. Hence, the device member will not come apart from vibration of a conveying belt during the assembly process. Moreover, after the write protect tab is disposed within the slide groove of the lower plastic shell, then the fixing pieces of the lower plastic shell and the fixing holes of the upper plastic shell are joined and fixedly bonded together. Finally, the position fixing pieces, the clasp hole pieces and the hook pieces located on a circumferential edge of the metallic shell are joined together one by one with the position fixing holes, the clasp pieces and the clasp holes of the upper plastic shell and the clasp pieces located on a circumferential edge of the lower plastic shell. In addition, the appropriately grounded portion located on the fourth terminal of the terminal set provides for direct electrical grounding with the metallic shell, which not only completes the assembly process, but also provides the Mini SD card adapter with grounding functionality. The Mini SD card adapter of the present invention provides more convenient and faster assembly compared to prior art adapter structures, and further achieves objective of reducing costs and increasing yield of the finished product.

To enable a further understanding of said objectives and the technological methods of the invention herein, brief description of the drawings is provided below followed by detailed description of the preferred embodiments.

DETAILED DESCRIPTION OF THE PREFERRED EMBODIMENTS

Figure 1:
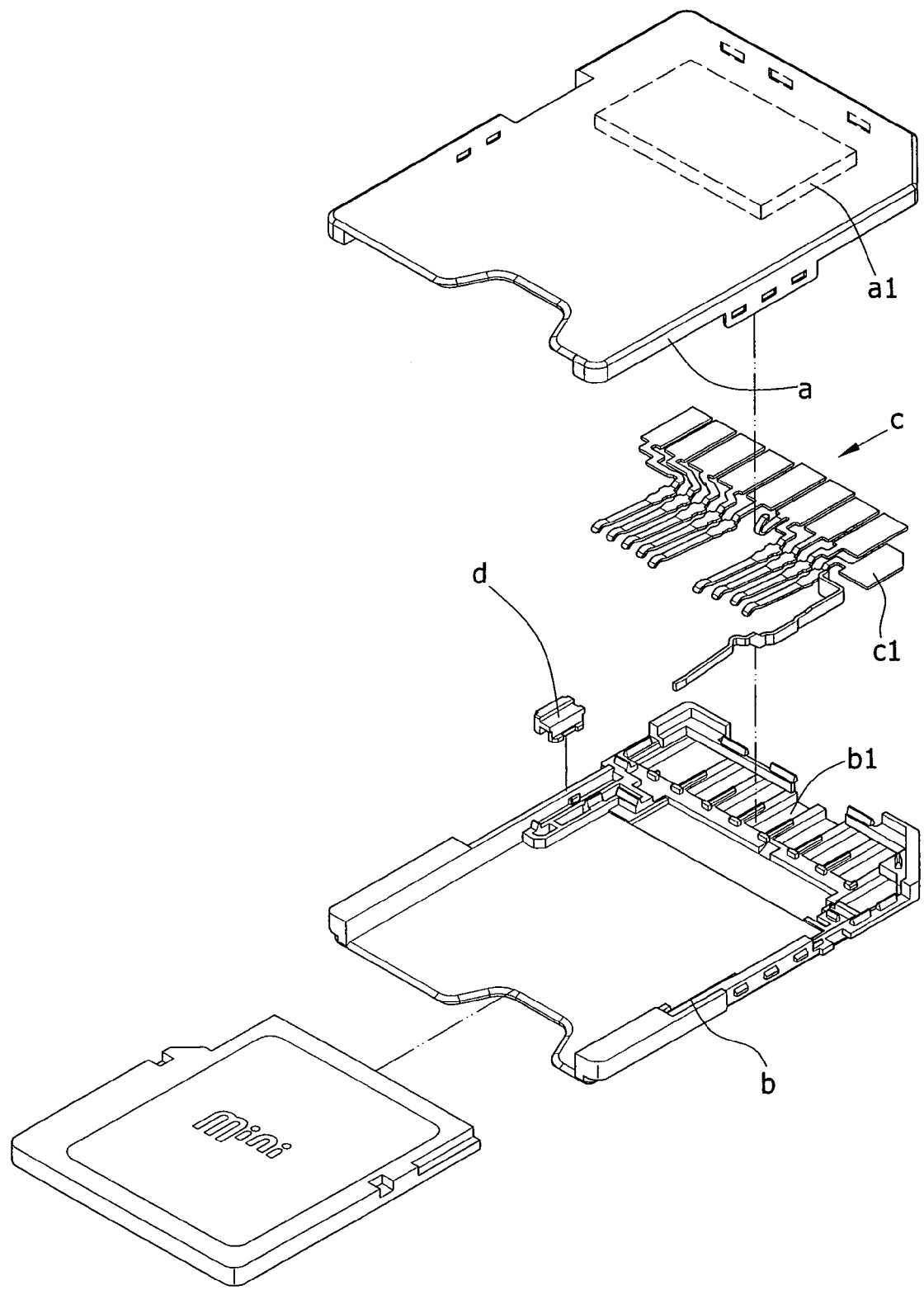
FIG. 1 shows a structural elevational view of prior art.
Figure 2:
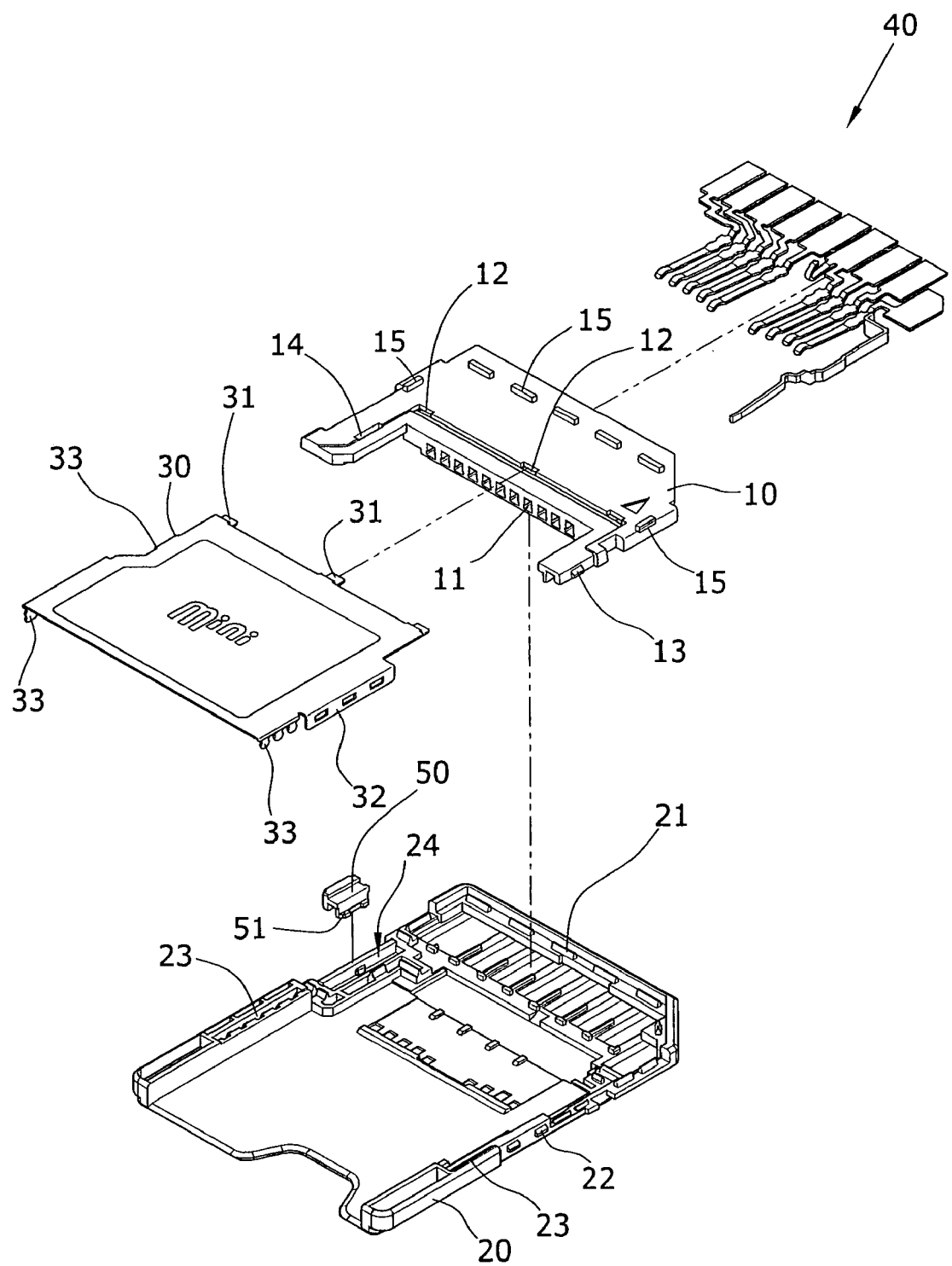
FIG. 2 shows an exploded elevational view according to the present invention.
Figure 3:
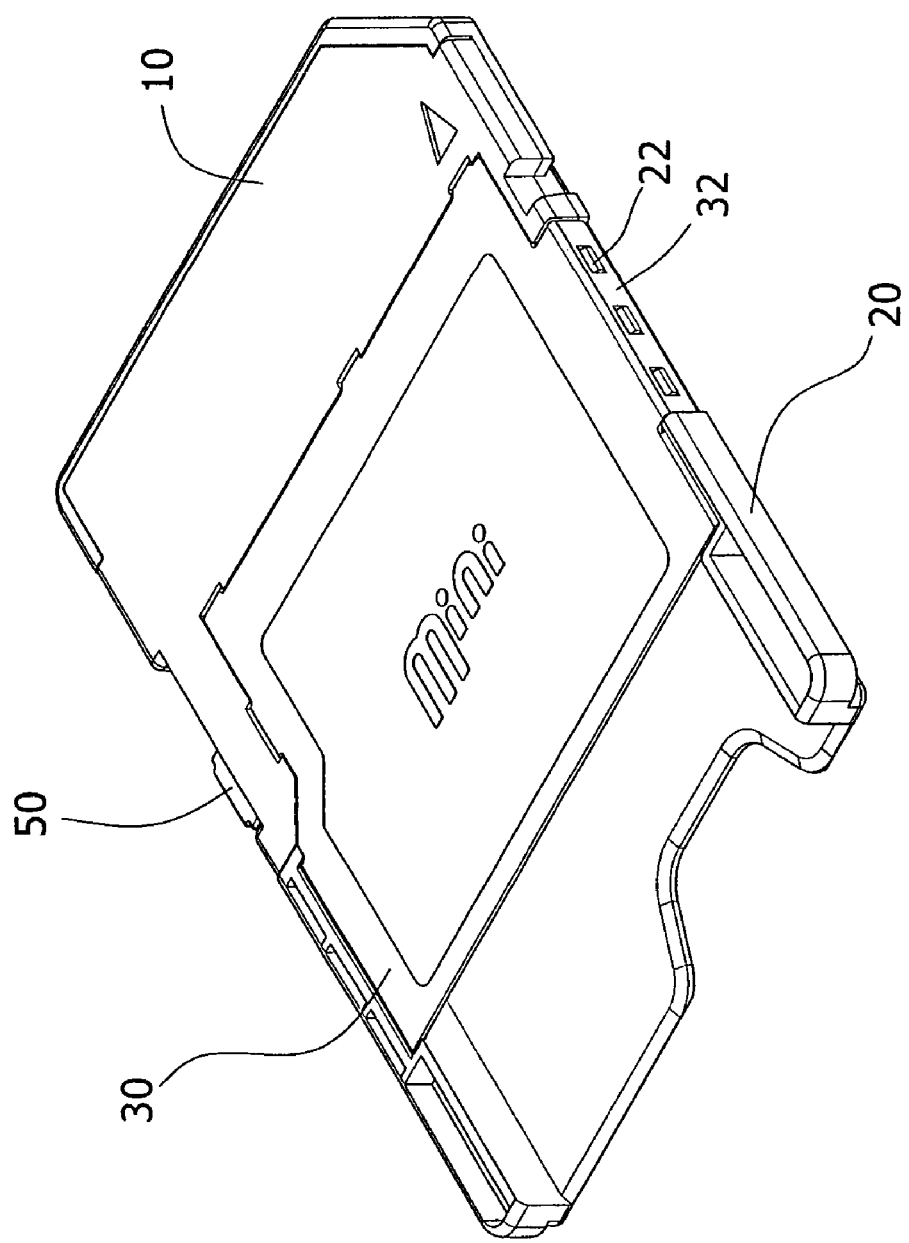
FIG. 3 shows an assembled elevational view according to the present invention.
Figure 4:
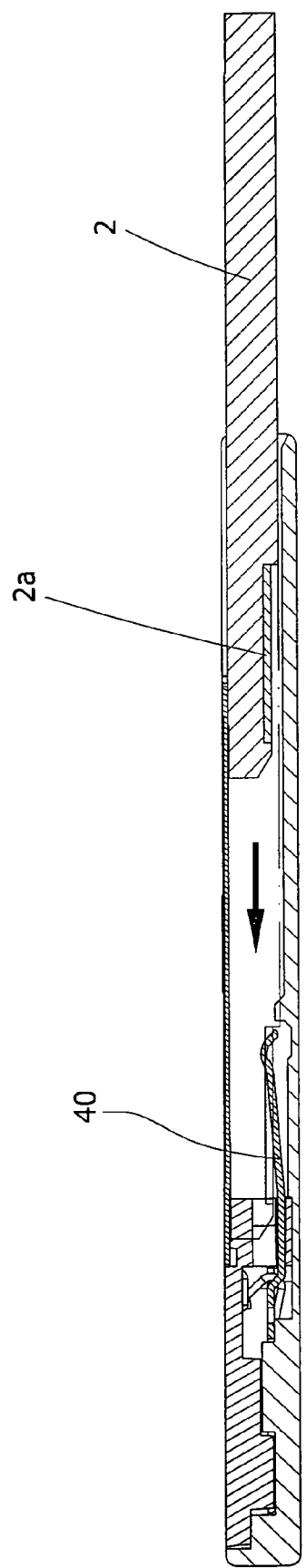
FIG. 4 shows a schematic view of the present invention in use.

Referring to FIGS. 2, 3 and 4, which show an improved structure of a Mini SD card adapter of the present invention, structured to comprise an upper plastic shell 10, a lower plastic shell 20, a metallic shell 30, a terminal set 40 and a write protect tab 50. Wherein the terminal set 40 is fixed within corresponding terminal holes 11 defined in the upper plastic shell 10 using a direct insertion method, and a plurality of position fixing holes 12, clasp pieces 13 and clasp holes 14 are respectively located on the upper plastic shell 10, which can be joined together with corresponding position fixing pieces 31, clasp hole pieces 32 and hook pieces 33 located on the metallic shell 30. Moreover, a plurality of fixing holes 15 are defined at appropriate positions in a periphery of an undersurface of the upper plastic shell 10, and appropriately sized fixing pieces 21, a plurality of clasp pieces 22 and clasp holes 23 are respectively located on the lower plastic shell 20 corresponding to the plurality of fixing holes 15. Furthermore, a slide groove 24, which is used for disposing the write protect tab 50 therein, is defined in one side of the lower plastic shell 20, and a toggle device 51 extends frontward from a front end of the write protect tab 50. In addition, an appropriately positioned bend of a fourth terminal 41 of the terminal set 40 serves as a grounded portion 41a that corresponds to one of the position fixing pieces 31 of the metallic shell 30 inserted within the position fixing holes 12 of the upper plastic shell 10, and makes direct electrical grounding with the metallic shell 30.

When assembling the Mini SD card adapter of the present invention, the terminal set 40 is fixed within the corresponding terminal holes 11 of the upper plastic shell 10 using a direct insertion method, and then the write protect tab 50 is disposed within the slide groove 24 of the lower plastic shell 20, whereupon the fixing pieces 21 of the lower plastic shell 10 and the fixing holes 15 of the upper plastic shell 10 are joined and fixedly bonded together. Finally, the position fixing pieces 31, the clasp hole pieces 32 and the hook pieces 33 located on a circumferential edge of the metallic shell 30 are joined together one by one with the position fixing holes 12, the clasp pieces 13 and the clasp holes 14 of the upper plastic shell 10 and the clasp pieces 22 located on a circumferential edge of the lower plastic shell 20. Moreover, the grounded portion 41a located on the fourth terminal 41 of the terminal set 40 provides for direct electrical grounding with the position fixing piece 31 of the metallic shell 30. Hence, the aforementioned configuration is provided with functionality to achieve easy assembly and convenient manufacture. When using the Mini SD adapter, a Mini SD card 2 is directly inserted into an opening slot at a front portion of the Mini SD adapter of the present invention, thereby effectuating an electrical contact between metal fingers 2a of an undersurface of the Mini SD card 2 and the corresponding terminal set 40 of the Mini SD adapter.

In conclusion, the improved structure of the Mini SD card adapter of the present invention has a configuration whereby the terminal set 40 directly inserted and fixed in an appropriate position of the upper plastic shell 10 to form an integrated body, which enables rapid assembly and achieves the objective of reducing costs. Furthermore, advancement of the present invention clearly complies with essential elements as required for a new patent application. Accordingly, a new patent application is proposed herein.

It is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. A Mini SD card adapter comprising an upper plastic shell, a lower plastic shell, a metallic shell, a terminal set and a write protect tab, and is characterized in that the terminal set is fixed within corresponding terminal holes defined in the upper plastic shell using a direct insertion method, wherein a plurality of position fixing holes, clasp pieces and clasp holes are respectively located on the upper plastic shell, which are joined together with corresponding position fixing pieces, clasp hole pieces and hook pieces located on the metallic shell, moreover, a plurality of fixing holes are defined at appropriate positions in a periphery of an undersurface of the upper plastic shell, and appropriately sized fixing pieces and a plurality of clasp pieces are respectively located on the lower plastic shell corresponding to the plurality of fixing holes, furthermore, a slide groove, which is used for disposing the write protect tab therein, is defined in one side of the lower plastic shell.

2. The Mini SD card adapter according to claim 1, wherein a toggle device extends frontward from a front end of the write protect tab.

3. The Mini SD card adapter according to claim 1, wherein an appropriately positioned bend of one terminal of the terminal set serves as a grounded portion that corresponds to one of the position fixing pieces of the metallic shell inserted within with position fixing holes of the upper plastic shell, and provides for direct electrical grounding with the metallic shell.

4. A Mini SD card adapter comprising an upper plastic shell, a lower plastic shell, a metallic shell, a terminal set and a write protect tab, and is characterized in that the terminal set is fixed within corresponding terminal holes defined in the upper plastic shell using a direct insertion method, wherein an appropriately positioned bend of one terminal of the terminal set serves as a grounded portion that corresponds to one of position fixing pieces of the metallic shell inserted within with position fixing holes of the upper plastic shell, and provides for direct electrical grounding with the metallic shell.

* * * * *